US006875977B2

(12) United States Patent
Wolter et al.

(10) Patent No.: US 6,875,977 B2
(45) Date of Patent: Apr. 5, 2005

(54) OPTOELECTRONIC KEYPAD AND METHOD FOR CONTROLLING AN OPTOELECTRONIC KEYPAD

(75) Inventors: Jurgen Wolter, Oberhausen (DE); Wolfgang Stelz, Oberhausen (DE); Detlef Ludwig, Duisburg (DE)

(73) Assignee: Krohne Messtechnik GmbH & Co., KG, Duisburg (DE)

( * ) Notice: Subject to any disclaimer, the term of this patent is extended or adjusted under 35 U.S.C. 154(b) by 271 days.

(21) Appl. No.: 10/243,864

(22) Filed: Sep. 13, 2002

(65) Prior Publication Data

US 2003/0090470 A1 May 15, 2003

(30) Foreign Application Priority Data

Sep. 13, 2001 (DE) .......................................... 101 45 248

(51) Int. Cl.[7] ................................................ H01J 40/14
(52) U.S. Cl. .................... 250/221; 340/407.1; 398/140; 341/31
(58) Field of Search ........................ 398/140; 250/221; 340/407.1; 341/20, 31; 345/173, 175

(56) References Cited

U.S. PATENT DOCUMENTS

| 4,243,879 A | * | 1/1981 | Carroll et al. | ............... 250/221 |
| 4,254,333 A | * | 3/1981 | Bergstrom | .................. 250/221 |
| 4,701,747 A | * | 10/1987 | Isherwood et al. | ........... 341/24 |
| 4,988,983 A | | 1/1991 | Wehrer | |
| 5,103,085 A | * | 4/1992 | Zimmerman | ................ 250/221 |

FOREIGN PATENT DOCUMENTS

| DE | 3611988 C3 | 10/1986 |
| DE | 4041144 C1 | 9/1992 |
| DE | 19654853 A1 | 11/1997 |
| WO | WO 85/04295 | 9/1985 |

OTHER PUBLICATIONS

European Search Report, Oct. 22, 2004.

* cited by examiner

Primary Examiner—Thanh X. Luu
Assistant Examiner—Stephen Yam
(74) Attorney, Agent, or Firm—Cesari and McKenna, LLP; John F. McKenna

(57) ABSTRACT

An optoelectronic keypad and a method for controlling an optoelectronic keypad for a measuring instrument, require a transparent touch screen, at least two touch-sensitive control buttons, at least two light emitters and at least two photodetectors, where said control buttons are located next to each other on one side of the surface of the touch-screen, the light emitters and the photodetectors are situated next to each other on the other side of the touch screen and each one control button, light emitter and photodetector are functionally associated with one another in a way as to constitute one action key, whereby pressing the control button of an action key causes the light emanating from the light emitter of that action key to be reflected at the actuated key and to impinge on the photodetector of that key. A central control and processing unit is also provided, the light emitters being connected to said central control and processing unit and the light emitters being time-controlled by the central control and processing unit in such fashion that at any one time only one of the juxtaposed light emitters is in the active state. This substantially reduces the risk of a detection error relative to the actuation of a key.

5 Claims, 3 Drawing Sheets

OPTOELECTRONIC KEYPAD AND METHOD FOR CONTROLLING AN OPTOELECTRONIC KEYPAD

RELATED APPLICATION

Not Applicable

BACKGROUND OF THE INVENTION

1. Field of the Invention

This invention relates to an optoelectronic keypad for a measuring instrument, including a transparent touch screen, at least two touch-sensitive control buttons, at least two light emitters and at least two light receivers i.e. photodetectors, where said control buttons are located next to each other on one side of the touch-screen surface, the light emitters and the photodetectors are situated next to each other on the other side of the touch screen and each one control button, light emitter and photodetector are functionally associated with one another so as to constitute one action key, whereby pressing the control button of an action key causes the light emanating from the light emitter of that action key to be reflected at the actuated key and onto the photodetector of that key. The invention further relates to a method for controlling this type of optoelectronic keypad for a measuring instrument. In this context, the above statement whereby the light emanating from the light emitter of the action key is reflected at that key when actuated means more specifically that the light is reflected for instance off a finger that is brought close to the key or presses the control button.

2. Description of the Prior Art

An optoelectronic keypad of the above type is described for instance in EP 0 618 680 A1. That particular optoelectronic keypad encompasses infrared light emitters and infrared photodetectors, with functionally associated infrared light emitters and receivers so positioned relative to each other that, when for instance a finger touches the respective control button or is close to it, the light from the infrared light emitter is retroreflected in such fashion that it impinges more or less exclusively on the infrared photodetector paired with the infrared light emitter concerned. In addition to the necessary alignment of the infrared light emitter with the corresponding infrared photodetector, infrared-reflective baffles and, respectively, non-infrared-reflective covers are provided. These are intended to prevent the light reflected off a finger on a given button, when touched, from being detected by infrared photodetectors other than the infrared photodetector assigned to the infrared light emitter whose light was reflected by the finger. If the retroreflected light were picked up by more than one infrared photodetector, it would no longer be possible to unambiguously determine which key was in fact actuated, or whether it was one key or two keys that were pressed at the same time.

It follows that in the optoelectronic keypad according to EP 0 618 680 A1, the limiting factor for the shortest possible distance between two keys is determined by the requirement that light emanating from the infrared emitter of a given key and reflected by the finger that is in contact with the control button of that key must not be picked up by the infrared receivers of neighboring keys. Another limiting factor for the smallest possible distance between two neighboring keys consists in the fact that, in the event of high reflectivity, even a slight, partial contact with a key, for instance when a finger touches not only the button surface of one single key, can cause several keys to respond.

Other problems associated with prior-art optoelectronic keyboards and keypads include the fact that intense ambient light such as bright sunshine can make it difficult to tell whether a key was pressed because the bright incident light has overpowered the photodetectors. Equally difficult, in the case of poor reflectivity, is the determination of whether a key was actuated, for instance when a key is pressed with a black glove covering the fingers. And finally, in practical implementation it is difficult to meet the requirement whereby the light detected by a receiver should essentially be limited to that reflected by the finger on the actuated key and not that transmitted by the touch screen, least of all by the outside surface of the latter, making it necessary to keep the distance between the light emitter and photodetector and the touch screen within very precise tolerances. Even minor spacing deviations, causing multiple reflections, lead to detection errors.

SUMMARY OF THE INVENTION

It is therefore the objective of this invention to introduce an optoelectronic keypad and a method for controlling an optoelectronic keypad which in simple fashion assures reliable detection of the actuation of a key without the risk of inadvertent actuation of the key next to the one that was pressed.

According to the invention, this objective with respect to optoelectronic keypads and keyboards as referred to above is achieved by means of a central control and processing electronics unit, by connecting the light emitters to the central control and processing unit and by providing for the central control and processing unit to time-control the light emitters in such fashion that at any one time only one of the mutually neighboring light emitters is energized.

Thus, according to the invention, the central control and processing unit ensures that within a specific time window only one of the mutually neighboring light emitters can in fact emit light so that light can impinge only on the control button paired with that particular light emitter. In other words, the invention makes it possible for only one out of any two juxtaposed light emitters to be activated. If, for example, a given key is surrounded by eight other keys, the light emitters associated with those eight keys will be deactivated while the light emitter of the central key is activated. Of course, keys that are positioned farther away from the key with the active light emitter may have their light emitters activated at the same time. There is no problem of detection errors due to retroreflected stray light detected by the "wrong" photodetectors when the keys are sufficiently far apart, i.e. when they are not in direct juxtaposition. Nevertheless, maximum assurance for the avoidance of the detection errors discussed is provided, in a preferred embodiment of the invention, when the central control and processing unit permits only one light emitter to be activated at any one time.

Regardless of whether only one light emitter can be activated at a time or whether several non-neighboring light emitters can be activated at the same time, a preferred design refinement of the invention provides for the photodetectors to be connected to the central control and processing unit and to be selectively addressable by the central control and processing unit in such fashion that it collects the light of only the photodetector whose companion light emitter is active. This virtually eliminates all and any risks of detection errors, since within a given time window defined by the central control and processing unit, only one light emitter and its associated single photodetector are active, or, in the case of multiple light emitter/photodetector pairings, only those can be activated for which there is no risk of detection errors. When in this preferred embodiment of the invention, the light emitter picks up reflected right, such light reflection necessarily indicating that the control button associated with the photodetector concerned was actuated, causing the light emanating from the associated light emitter to be reflected back.

Thus, in the preferred embodiment of the invention as described above, the optoelectronic keypad is operated in a way whereby all paired light emitters and photodetectors are sequentially activated pair-by-pair. Given that the typical detection time of the commonly used infrared photodetectors is less than 1 msec, the sequential, consecutive activation of the various pairs of matched light emitters and photodetectors can take place at a frequency of about 1 kHz or higher. The fact that pressing a key with a finger usually takes at least 1 sec makes it readily obvious that in the case of a keypad with some ten keys at the most, the actuation of a key in the manner described is detectable without a problem.

The functionality and design of an optoelectronic keypad for a measuring instrument are usually intended to serve the purpose of adjusting and controlling the measuring instrument via that keypad. Accordingly, the actuation of a key on the keypad generates a command signal. This command signal triggers the desired function in the measuring instrument. In this connection, it may be desirable and helpful if, as in a preferred embodiment of the invention, that key-operated function is accompanied by a visual display that can be controlled via the central control and processing unit.

Finally, in an enhanced embodiment of the invention, the central control and processing unit consists of a microprocessor-based controller. That micro-controller may incorporate an analog-to-digital converter with a number of input ports that corresponds to the number of keys on the optoelectronic keypad. While it is not imperative for the A/D converter to be integrated into the micro-controller, such integration facilitates the configuration of a compact optoelectronic keypad unit. In a further, preferred embodiment of this invention, an amplifier circuit is interpositioned between each input port of the A/D converter in the micro-controller and each corresponding photodetector for the purpose of amplifying the signal emanating from the respective photodetector.

In another conceptual refinement of the optoelectronic keypad, a communication system is provided, at least one light emitter and/or at least one photodetector is connected to the communication system, and the light emitter and/or photodetector can be accessed by the communication system in such fashion that data transmitted via the light emitter or acquired by the photodetector can be used for communication with an external device. This enhanced feature is employable with the above-described keypad unit according to the invention as well as with conventional optoelectronic keypads and keyboards. Suitably equipped, an optoelectronic keypad offers the advantage of permitting wireless data communication between the said external device and the measuring instrument without requiring any additional hardware. This means that no separate transceiver system is needed for such wireless communication since that function can be performed by the existing keys on the optoelectronic keypad in conjunction with their respectively associated light emitter and photodetector. Equipping a measuring instrument with this type of data transfer capability thus becomes a very inexpensive proposition. Of course, during any such communication between the optoelectronic keypad and the external device, the keyboard is not available for use in the traditional sense.

In the preferred embodiment, the light emitter, together with its companion photodetector, can be used for communication with the external device. Correspondingly, it is one key with its associated light emitter and photodetector that handles the communication with the external device, which facilitates the necessary alignment of the communication port of the external device with the optoelectronic keypad.

The correct alignment of the external device with the optoelectronic keypad is further facilitated in a preferred embodiment of this invention by allowing the joint use of the light emitter with multiple photodetectors, and preferably in combination with all photodetectors, for communication with the external device. Specifically, it is possible to employ all photodetectors "simultaneously", meaning that at any time several photodetectors can be in a "standby mode" as it were, whereby establishing communication with the external device becomes that much easier.

In a further, preferred refinement of the invention, the photodetector is provided with adjustable gain control, permitting reduced signal amplification for the purpose of a data transfer. This broadens the bandwidth of the data transmission and speeds up the transfer rate. So far, maximum data transfer rates of up to 115 kBaud have been attained. In particular, this type of data transfer permits adaptation at least in part to the IrDA standard, meaning that a serial asynchronous, a bi-directional and an H-level transfer via short pulses ($3/16$ length of a bit) are possible. The activation of the data transfer is initiated by a log-on process. This can be accomplished either by a particular pulse sequence sent by the external device and recognized by the measuring instrument while in regular key-controlled operation, or by periodic attempts on the part of the measuring instrument at initiating a data transfer.

According to the invention, the objective specified above is achieved by the aforementioned method for controlling an optoelectronic keypad in that the light emitters are time-controlled in such fashion that at any one time only one of the mutually neighboring light emitters is activated.

According to a preferred implementation of the method according to this invention, the evaluation of the signal emanating from a given photodetector is performed with reference to the signal received from at least one other photodetector. This means that after the consecutive sampling of the light signals from the individual photodetectors, a comparison is made of the signals emanating from the photodetectors. This can be used to particular advantage in determining which key was pressed when the keypad is subjected to very bright light flooding the photodetectors. In any such situation, it would be difficult to detect the light reflected off the finger that rests on a control button. But since the finger blocks the light, it creates a signal for the photodetector associated with the actuated key that differs from that of the other photodetectors.

As an additional feature in a preferred enhancement of the invention, the threshold above which a reflection is attributed to the actuation of a key is compared to that of at least one other key and preferably to that of all other keys. This provides for a significantly improved sensitivity compared to conventional optoelectronic keypads, making even weak reflections detectable, such as those produced by a finger covered by a black glove.

Other preferred conceptual enhancements of the method of this invention for controlling an optoelectronic keypad follow in analogous fashion the above-described preferred embodiments of the optoelectronic keypad according to the invention.

BRIEF DESCRIPTION OF THE DRAWINGS

There are numerous ways in which the optoelectronic keypad according to the invention and the above-described method for controlling the optoelectronic keypad can be implemented and further enhanced. In this context, attention is invited to the dependent claims and to the following description of preferred embodiments of the invention with reference to the attached drawings, in which:

DESCRIPTION OF THE PREFERRED EMBODIMENTS

Figure 1:
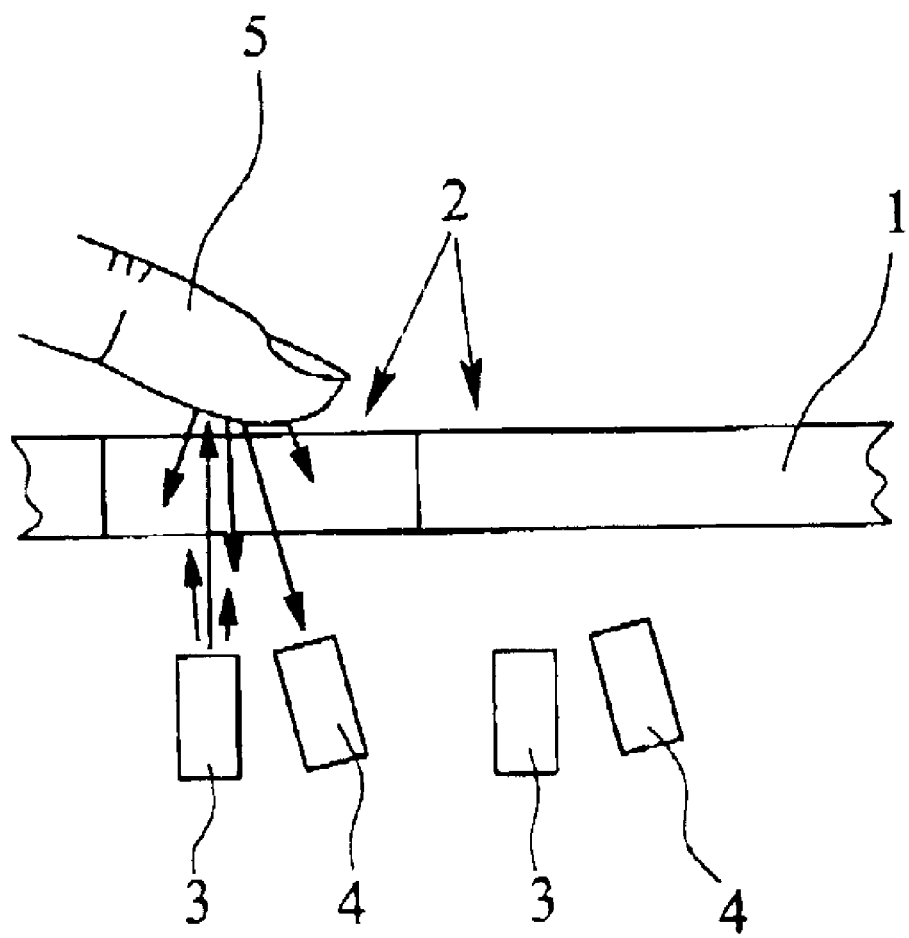
FIG. 1 illustrates schematically a section of an optoelectronic keypad according to a preferred embodiment of the invention, with a finger actuating the key.

FIG. 1 is a schematic illustration of a sectional segment of an optoelectronic keypad for a measuring instrument, representing a preferred embodiment of the invention. The optoelectronic keypad encompasses a transparent touch screen 1 with two touch-sensitive control buttons 2 on its upper surface. Located underneath each control button 2 on the touch screen 1 are a light emitter 3 and a photodetector 4. The light emitter 3 sends light, in this case infrared light, in an upward direction essentially perpendicular to the plane of the touch screen 1. When a key is actuated by virtue of a finger 5 touching the control button 2 on the touch screen 1, the light emanating from the light emitter 3 is reflected by the finger 5 and at least part of it returns to the photodetector 4 so that the photodetector 4, capturing that light signal, registers the actuation of the key concerned.

Figure 2:
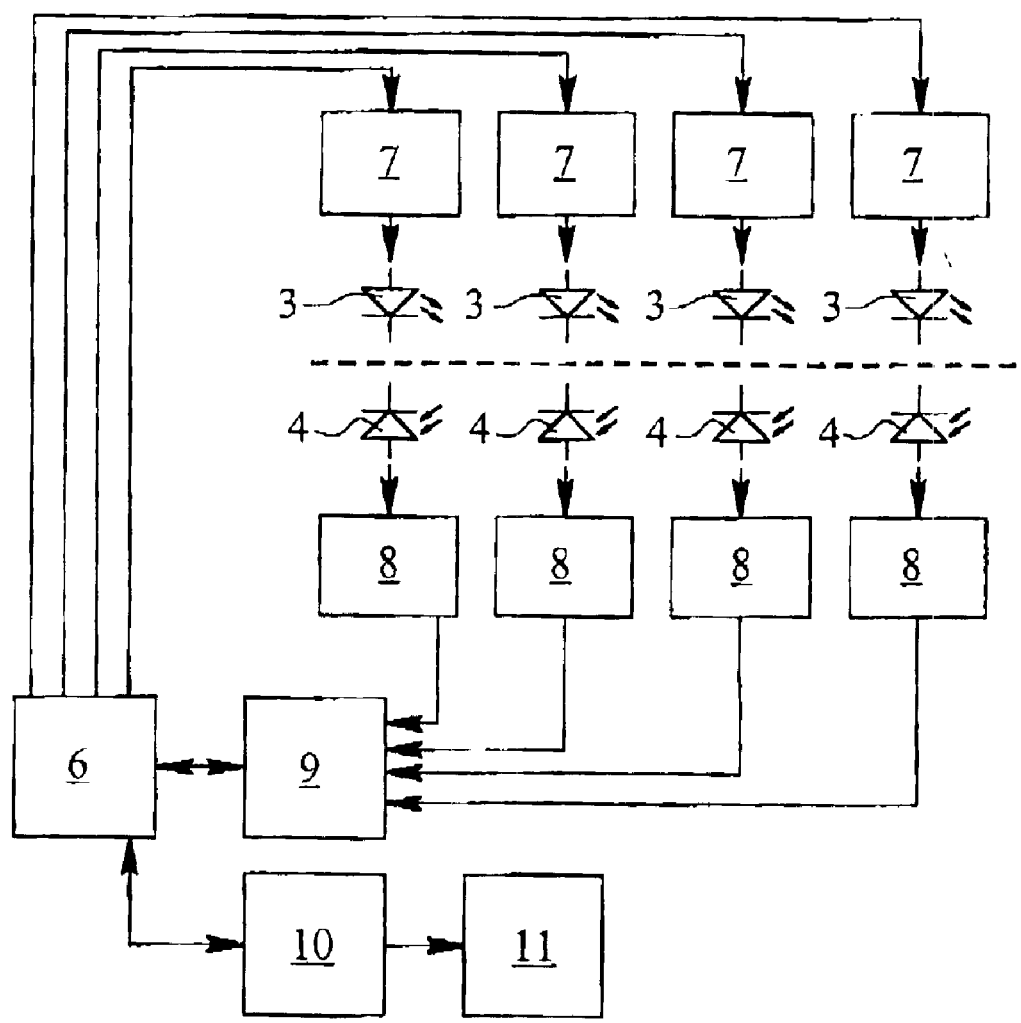
FIG. 2 shows schematically the configuration of an optoelectronic keypad according to a preferred embodiment of the invention.

FIG. 2 illustrates in schematic fashion the configuration of an optoelectronic keypad according to a preferred embodiment of the invention. The important element here is a central control and processing unit 6 that connects to all light emitters 3 and to all photodetectors 4. In the example shown, four light emitters 3 and, associated with each such light emitter 3, four photodetectors 4 are arranged in a linear array. Beside the two light emitters 3 and photodetectors 4 in the middle there are two neighboring light emitters 3 and, respectively, two photodetectors 4, whereas the outer light emitters 3 and photodetectors 4 only have one neighboring light emitter 3 and, respectively, one photodetector 4.

The central control and processing unit 6 is connected to each light emitter 3 via a switch 7. By way of the respective switch 7 the central control and processing unit 6 can address each individual light emitter 3. The central control and processing unit 6 activates the switches 7 in sequential order, so that at any one time only one single light emitter 3 is active, emitting light.

Connected in series with each photodetector 4 is an amplifier 8 that amplifies the signal issuing from the photodetectors 4. This amplified signal is fed into an analog-to-digital converter 9 that is equipped with a number of input ports matching the number of photodetectors 4. This A/D converter digitizes the analog signals emanating from the photodetectors 4 and forwards them to the central control and processing unit 6 which in the case of the preferred embodiment of the invention is in the form of a microcontroller.

The mode in which the optoelectronic keypad in a preferred embodiment of the invention according to FIG. 2 operates is such that, as a function of the light emitters 3 sequentially activated via the switches 7, the central control and processing unit 6 collects and evaluates only the signal derived at the moment concerned from the photodetectors 4 that is associated with the light emitter 4 currently activated. This makes certain that when a signal is detected by a photodetector 4, it means that the corresponding key was in fact actuated, i.e. that the signal was triggered by a retroreflection of the light emanating from the associated light emitter 3. Mistaking the key that was activated by the reflection of light onto the "wrong" photodetector 4 is thus virtually impossible.

By way of a display control 10, the central control and processing unit 6 connects to a display device 11 for the functions selected with the optoelectronic keypad. The user of the measuring instrument equipped with the optoelectronic keypad is thus given an acknowledgment, immediately after pressing the key, of the function that has been selected which provides him/her with a monitoring and safety mechanism.

Figure 3:
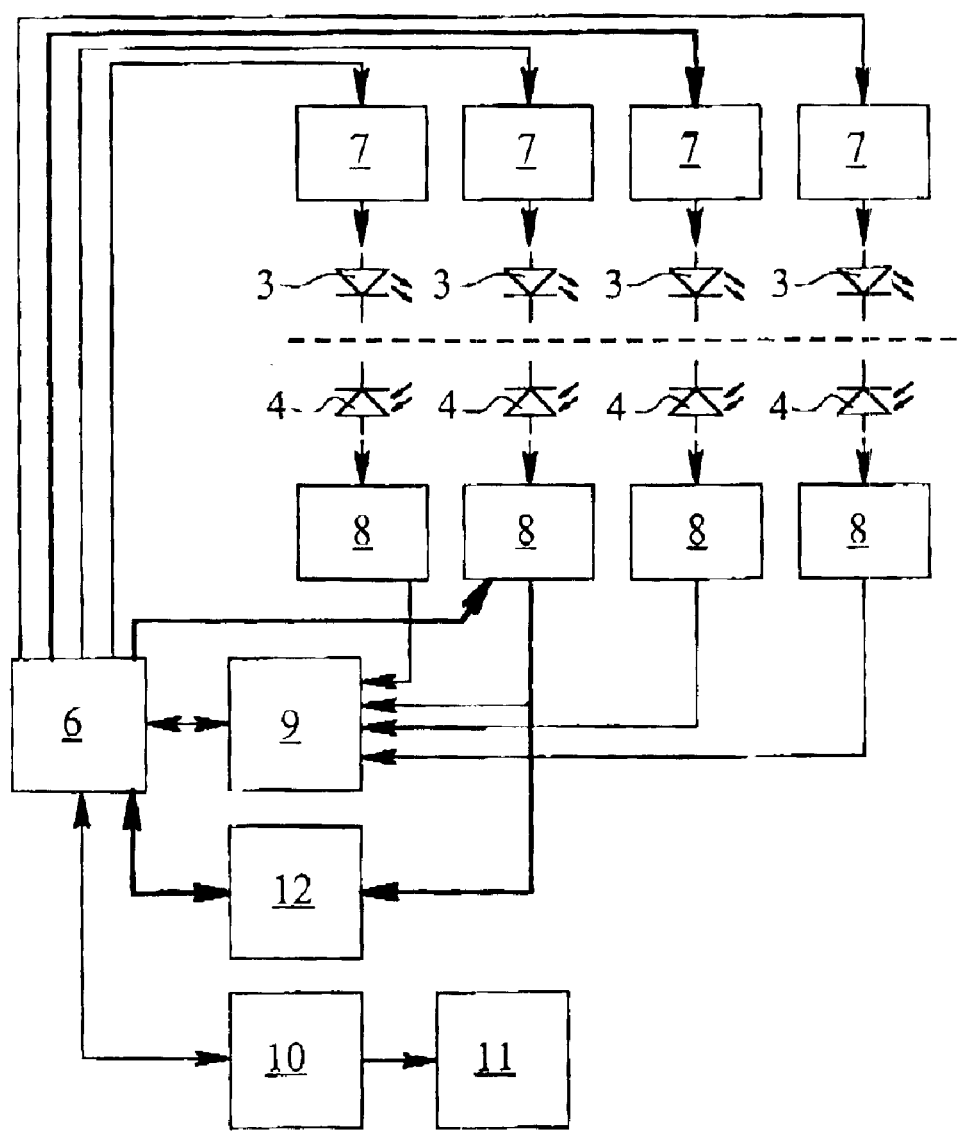
FIG. 3 shows schematically the configuration of an optoelectronic keypad according to another preferred embodiment of the invention.

FIG. 3 illustrates an optoelectronic keypad according to another preferred embodiment of the invention. The configuration of this other preferred embodiment of the invention as shown in FIG. 3 is essentially identical to that of the optoelectronic keypad describe above, except that it additionally incorporates a comparator 12 and, indicated by the arrow, a gain control for the amplifier 8 connected to the comparator 12, permitting the control of the amplification parameters by the central control and processing unit 6.

Moreover, the preferred embodiment of the invention shown in FIG. 3 provides for the use of a light emitter 3 and of a photodetector 4 for communication with an external device. To that effect, as indicated by a bold arrow, the second light emitter 3 from the right and the second photodetector 4 from the left are addressed by the central control and processing unit 6 via the corresponding switch 7 and the associated amplifier 8. Specifically, the light emitter 3 selected for the communication with the external device is controlled, via the appropriate switch 7, in such fashion that the light data generated by it along a predefined format and protocol, can be received and read by the external device. Light data transmitted by the external device can be received by that particular photodetector 4 and are fed to the comparator 12 for evaluation of the information contained in the light data and forwarding to the central control and processing unit 6.

The amplification rate of the amplifier 8 associated with the photodetector 4 that serves to receive the light data transmitted by the external device can be controlled by the central control and processing unit 6 and is reduced for the transfer of data from the external device. Reducing the gain of the amplifier 8 broadens the attainable bandwidth and augments the achievable transfer rate. By employing this technique, the maximum data transfer rates currently possible are as high as 115 kBaud.

The data transfer between the external device and the optoelectronic keypad in this particular preferred embodiment of the invention is activated by a log-on process. To that effect the log-on process may be initiated by special pulse sequences transmitted by the external device and recognized by the optoelectronic keypad while it is in the regular keypad mode. Alternatively, the log-on process can be initiated by periodic attempts on the part of the optoelectronic keypad at establishing a connection for the data transfer between it and an external device. The transfer characteristics in the case of the preferred embodiment of the invention as described above is partly adapted to the IrDA standard. A serial asynchronous transfer, a bi-directional transfer as well as an H-level transfer via short pulses (3/16 length of a bit) are possible. When there is no data transfer between the optoelectronic keypad and the external device, the optoelectronic keypad can again be used for regular keypad operation.

What is claimed is:

1. A method for providing communication of an optoelectronic keypad for a measuring instrument with an external device comprising of the following steps:

providing an optoelectronic keypad with a transparent touch screen, at least two touch-sensitive control buttons, at least two light emitters each having an active state, at least two photodetectors, wherein said control buttons are located next to each other on one side of the surface of the touch-screen, the light emitters and the photodetectors being situated next to each other on the other side of the touch screen, and each one control-button, light emitter and photodetector are functionally associated with one another in a way as to constitute on action key, and wherein pressing the control button of an action key causes the light emanating from the light emitter of the pressed action key to be reflected at the actuated key and to impinge on the photodetector of that key;

providing a central control and processing unit, wherein light emitters are connected to the central control and processing unit;

providing a communication unit, wherein at least one light emitter and/or at least one photodetector is connected to said communication unit;

accessing said at least one light emitter and said at least one photodetector by the communication unit in such fashion that light data generated along a predefined format and protocol containing information and transmitted via said at least one light emitter or received by said at least one photodetector is used for communication with the external device;

providing a comparator for data evaluation;

controlling the at least one light emitter selected for the communication with the external device in such fashion that the light data generated by it is received and read by the external device, and light data transmitted by the external device is received by the at least one photodetector selected for the communication with the external device and is fed to the comparator;

evaluating the information contained in the light data transmitted by the external device, and forwarding the information contained in the light data transmitted by the external device to the central control and processing unit.

2. The method according to claim 1, including the additional steps of:

providing an amplifier connected in series with said at least one photodetector selected for the communication with the external device and means for controlling the gain of the amplifier, and controlling the gain of the amplifier such that during the communication with the external device the gain of the amplifier is reduced.

3. The method according to claim 1 or 2, including the additional step of:

using the at least one light emitter selected for the communication with the external device together with its functionally associated photodetector for the communication with the external device.

4. The method according to claim 1 or 2, including the additional step of:

using the at least one light emitter selected for the communication with the external device together with a plurality of said at least two photodetectors for the communication with the external device.

5. The method according to claim 4, including the additional step of:

using the at least one light emitter selected for the communication with the external device together with all of said at least two photodetectors for the communication with the external device.

* * * * *